United States Patent
Benmayor Vivas et al.

(10) Patent No.: US 6,666,323 B2
(45) Date of Patent: Dec. 23, 2003

(54) LOADER/UNLOADER OF PRINTED CIRCUITS

(76) Inventors: León Benmayor Vivas, Bach 2-B Pol. Ind., Foinvasa, 08110 Moncada 1 Reixac, Barcelona (ES); Eduardo Benmayor Vivas, Bach 2-B Pol. Ind., Foinvasa, 08110 Moncada 1 Reixac, Barcelona (ES)

(*) Notice: Subject to any disclaimer, the term of this patent is extended or adjusted under 35 U.S.C. 154(b) by 120 days.

(21) Appl. No.: 10/062,750

(22) Filed: Feb. 1, 2002

(65) Prior Publication Data
US 2002/0102152 A1 Aug. 1, 2002

(30) Foreign Application Priority Data
Feb. 1, 2001 (ES) .......................................... 200100243

(51) Int. Cl.7 .............................................. B65G 47/24
(52) U.S. Cl. .................... 198/409; 414/798.5; 414/779; 414/783; 414/737
(58) Field of Search .................... 198/409; 414/416.01, 414/418, 732, 737, 738, 742, 779, 783, 798.5, 798.9

(56) References Cited

U.S. PATENT DOCUMENTS

| | | | | | |
|---|---|---|---|---|---|
| 3,541,597 | A | * | 11/1970 | Segawa et al. | 414/798.5 |
| 4,093,083 | A | * | 6/1978 | Klaus | 414/798.5 |
| 4,863,340 | A | * | 9/1989 | Masunaga et al. | 414/789.5 |
| 4,903,818 | A | * | 2/1990 | Loehr et al. | 198/409 |
| 5,984,624 | A | * | 11/1999 | Opfer et al. | 414/798.5 |

FOREIGN PATENT DOCUMENTS

| | | |
|---|---|---|
| DE | 19540275 | 4/1997 |
| EP | 0369475 | 5/1990 |
| EP | 1059836 | 12/2000 |

* cited by examiner

Primary Examiner—Dean J. Kramer
(74) Attorney, Agent, or Firm—Ostrolenk, Faber, Gerb & Soffen, LLP

(57) ABSTRACT

1-Loader/unloader of printed circuits that includes a chassis (1) that carries a storage tray (2), a conveyor belt (4) and a mechanism for transferring the printed circuits (3) from the storage tray to the conveyor belt and vice versa. The transfer mechanism consists of a handling device comprising an arm (6) equipped with suction pads (5) for securing the printed circuits, which is moveable angularly between a receiving position, coinciding with the storage tray, and a final position, coinciding with the conveyor belt.

4 Claims, 4 Drawing Sheets

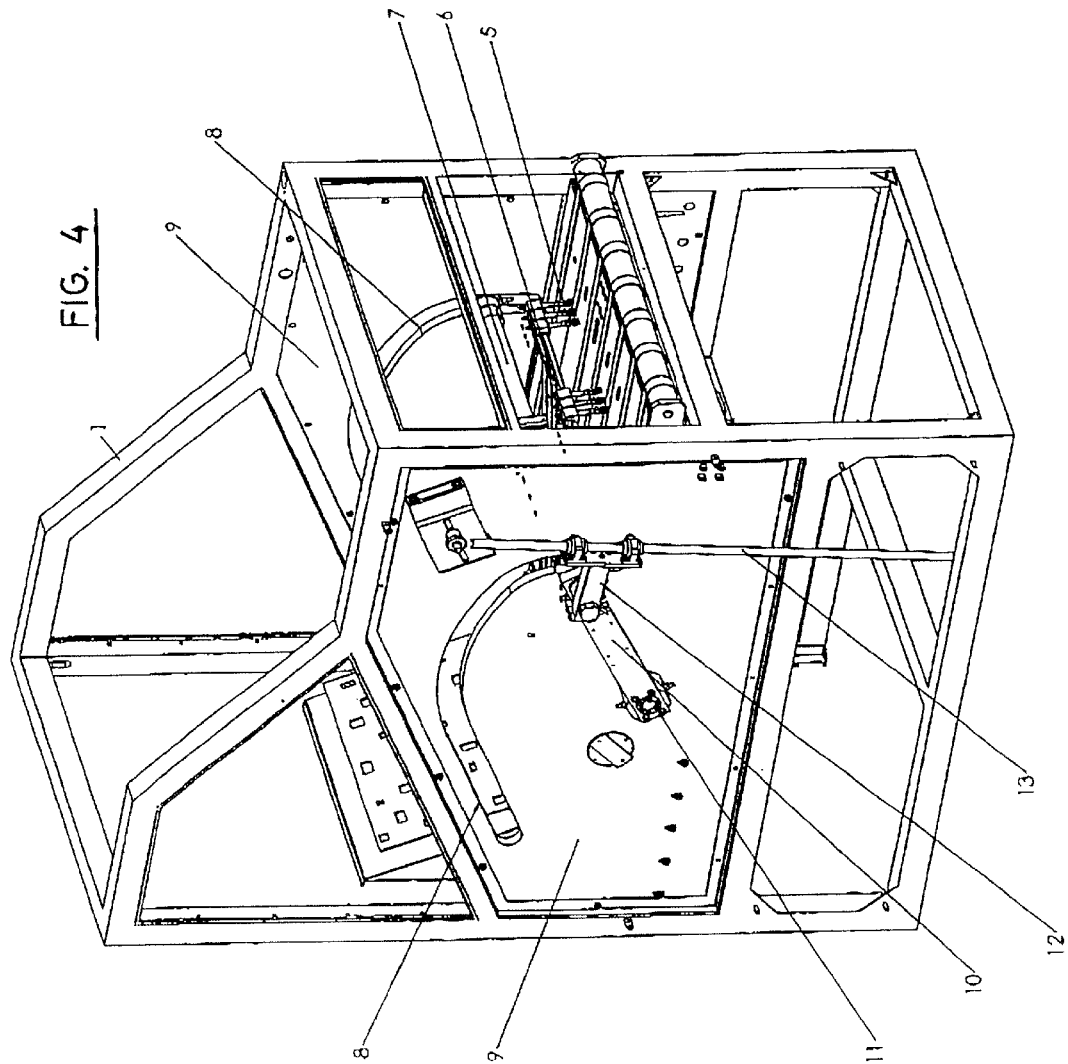

LOADER/UNLOADER OF PRINTED CIRCUITS

PURPOSE OF THE INVENTION

This present invention relates to a loader/unloader applicable to printed circuit production lines.

The loader/unloaders fulfil the function of automatically supplying, withdrawing and stacking the printed circuits of a process line for their transfer to the following process line. For this they have a storage tray, their own conveyor belt and means for manipulating and transferring the printed circuits from the storage tray to the conveyor belt and vice versa.

BACKGROUND TO THE INVENTION

Generally the manufacture of printed circuits comprises various stages or processes that are carried out on different lines, at the end of which it is necessary to stack them in order to transfer them to the next process line.

In this sort of process line, the printed circuits are transported in a horizontal position one by one.

In order to minimise the intervention of the operator and automate as much as possible the manufacturing process the use is now known of machines whose purpose is to transfer the circuits, one by one, from the stack to the process line and vice versa.

For this purpose, this type of machine needs to handle delicately the printed circuits, for which it has an articulated arm that has to make determined movements of transfer and rotation, said arm being suspended from the roof or from one of the walls of the machine.

The articulated arm must be actuated by various motors to achieve the synchronization of all the necessary movements, which implies a mechanical complexity that results in a greater number of breakdowns, greater time for adjustment and programming, etc., very important factors to be taken into account in this type of machine, given that, by definition, they have to work continuously, without interruptions and with minimum intervention time on the part of the operator.

Another disadvantage in this type of machine is that almost all the process lines have different heights with respect to the floor, because of which for their use they have to be adapted to each of the lines.

DESCRIPTION OF THE INVENTION

The loader/unloader of printed circuits proposed by the invention fully resolves the aforementioned problems in a manner that simplifies the design of the machine and allows adjusting to the different heights of the process lines.

For this, and more specifically, the printed circuit loader/unloader includes a storage tray support chassis, a conveyor belt and means for transferring the printed circuits from the storage tray to the conveyor belt and vice versa.

Said means of transfer consist of a handling device consisting of an arm equipped with suction pads for securing the printed circuits, which is moveable angularly between a receiving position, coinciding with the storage tray, to a final position coinciding with the conveyor belt, which arm is fixed to a transversal bar that can move and rotate between two identical slots implemented in opposing positions in respective side panels of the chassis.

Said bar is connected with freedom to rotate, to an extendible lever that is joined to the shaft of an actuating motor and causes the movement of the bar along the slots.

Likewise, it is connected to a pivoting rod, through a carriage moveable along said rod, which causes the rotation of the bar.

Both the movement and the rotation of the handling device are driven by a single actuating motor.

The rod pivots about its free end, around a hinged point moveable on a swivel orifice, inclined and parallel to the upward linear first section of the slot, in order to be able to adjust the inclination of the handling device to the inclination and height of the conveyor belt, all of which without altering its inclination with respect to the storage tray.

DESCRIPTION OF THE DRAWINGS

To complete the description being made and with the aim of assisting in a better understanding of the characteristics of the invention, according to a preferred example of practical embodiment thereof, a set of drawings is included as an integral part of said description, wherein, by way of illustration and not restrictively, the following is represented:

FIG. 4 shows a view in perspective similar to that of FIG. 1 in which the handling device is in the opposite position.

PREFERRED EMBODIMENT OF THE INVENTION

In view of the figures described it can be seen how the printed circuit loader/unloader proposed by the invention, is formed by a chassis or metal structure (1) which supports the different mechanisms that constitute it.

Figure 1:
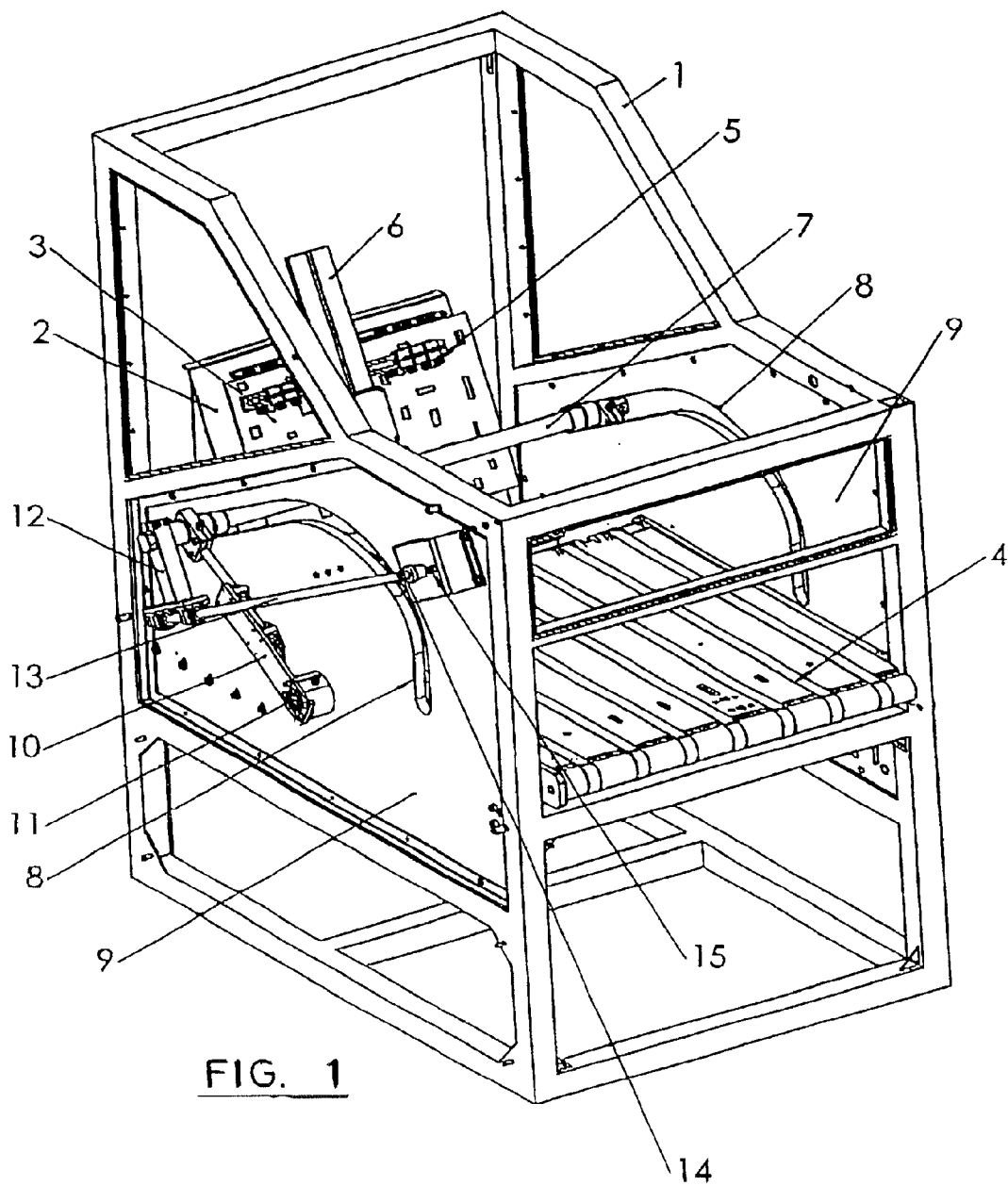
FIG. 1 shows a view in perspective of the printed circuit loader/unloader implemented in accordance with the purpose of this invention, in which the handling device is positioned opposite the storage tray.
Figure 2:
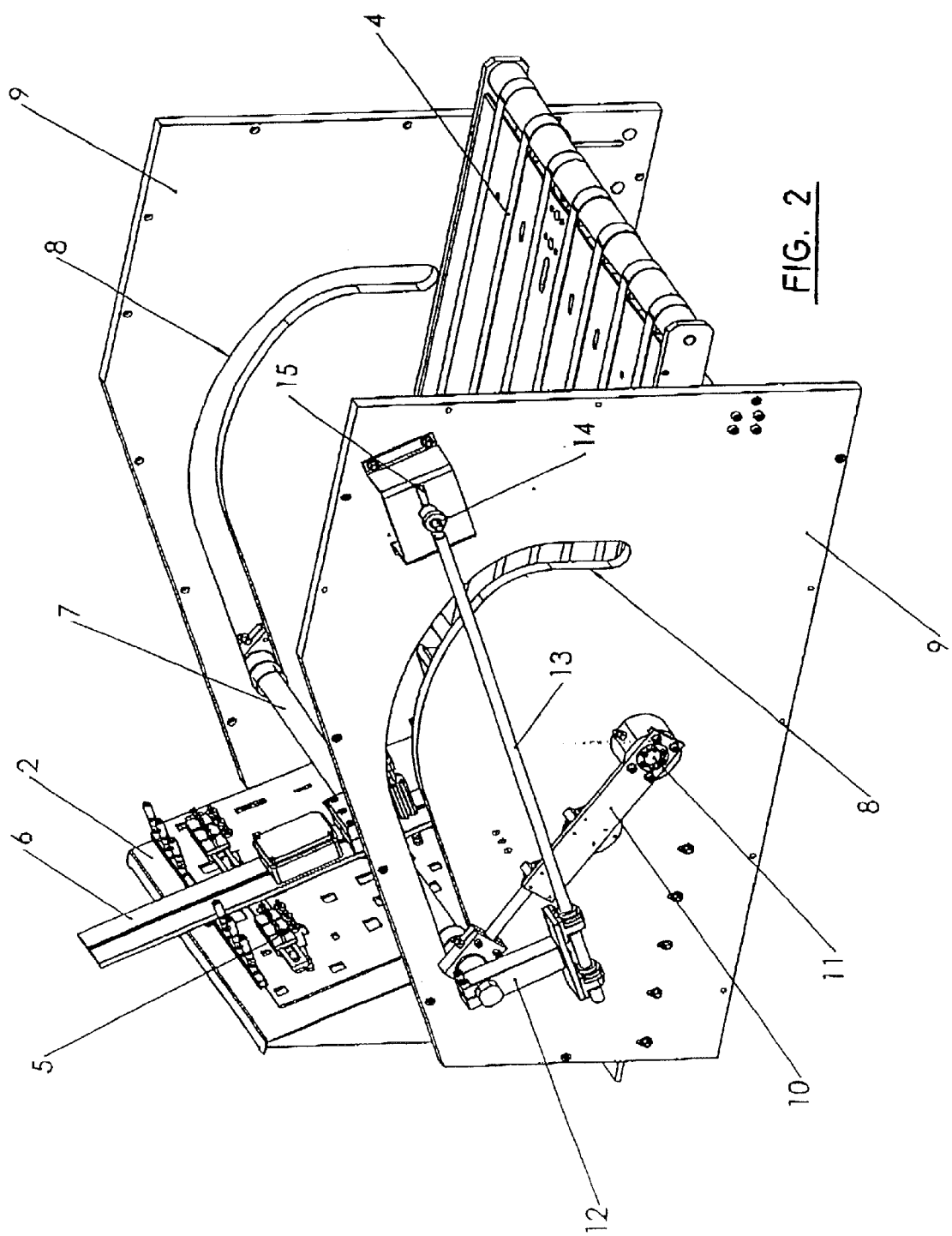
FIG. 2 shows a view in perspective of the handling device without the machine chassis.
Figure 3:
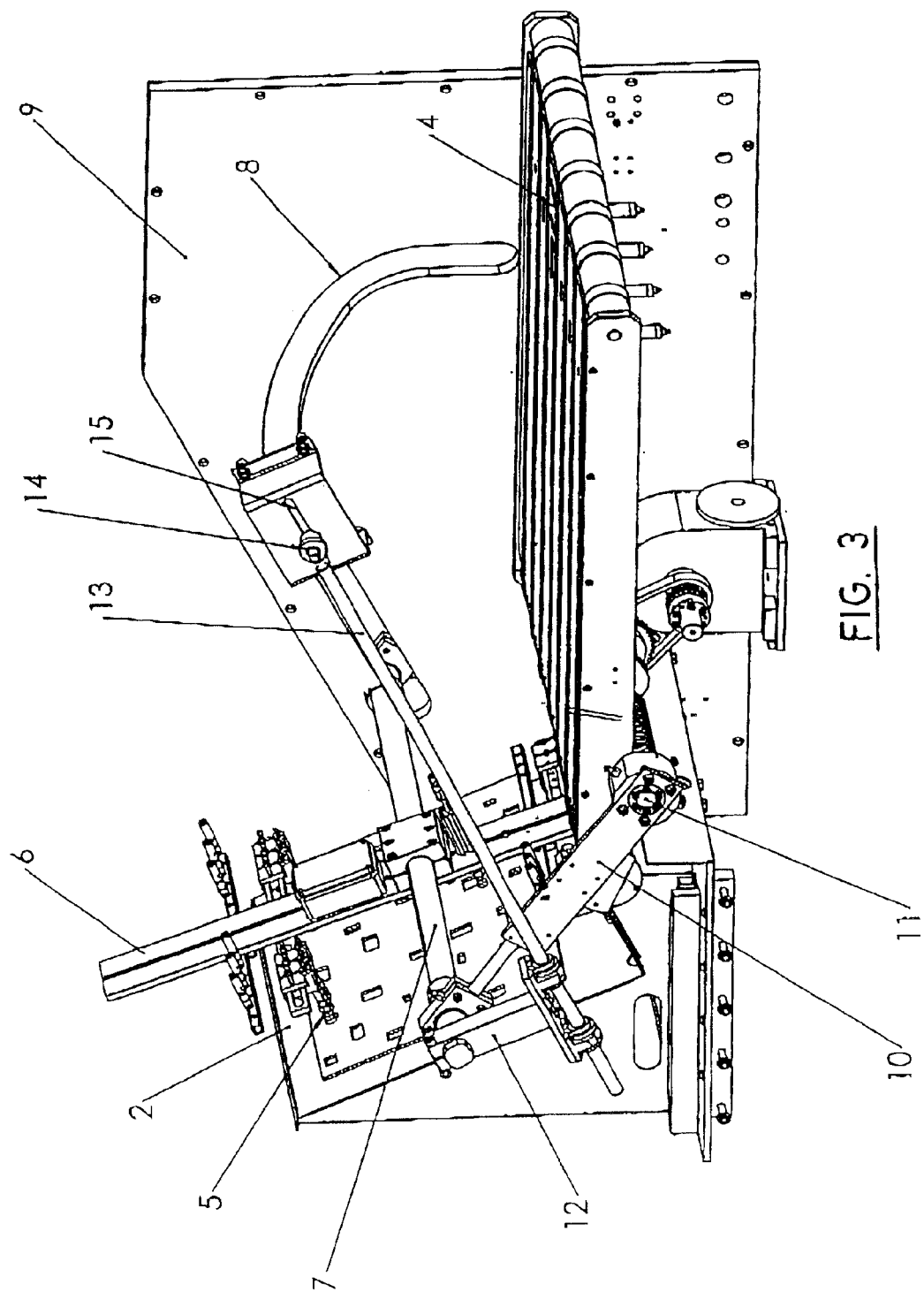
FIG. 3 shows a view in perspective similar to that of FIG. 2 in which one of the side panels has been removed to reveal fully the handling device and the conveyor belt.

As can be seen in FIG. 1 the loader/unloader has a storage tray (2) for the printed circuits (3), which adopts an inclined position to avoid damaging them.

The printed circuits (3) must be transferred from the storage tray (2) to the conveyor belt (4) that supplies the pertinent process line or in the opposite sense, that is, it collects them from the end of the process line and piles them up.

To carry out said transfer it has a handling device that correctly positions the printed circuits one by one, from the conveyor belt (4) to the storage tray (2) or vice versa.

Said handling device consists of an arm (6) equipped with suction pads (5) connected to a vacuum system for securing the printed circuits (3), which carries out a simultaneous repetitive movement of transfer and rotation from the storage position to the exit position and vice versa.

The arm (6) is fastened to a transversal bar (7) that can move and turn between two identical slots (8) implemented in opposing positions in respective side panels (9) of the chassis, which comprises a rising linear first section, a falling curved second section and a vertical linear third section.

The transversal bar (7) that firmly supports the arm (6) is connected with freedom to rotate, to an extendible lever (10) that is joined to the shaft of the actuating motor (11). The connection of the transversal bar (7) with the extendible lever (10) allows the free rotation of the shaft with respect to the lever.

Given that the distance between the shaft of the actuating motor (11) and the transversal bar (7) varies as said bar moves along the length of the slot (8), the lever (10) is extendible.

The printed circuits (3) are transferred from the storage tray (2) to the conveyor belt (4), for which it is necessary to orient them correctly from the inclined position of the tray (2) to the final position of the conveyor belt (4) and vice versa, synchronizing the transfer movement of the arm (6) with the rotation of the transversal bar (7).

For this, the transverse bar (7) has a carriage (12) fixed to one of its ends that moves linearly along a rod (13) which pivots about its free end, about a hinged point (14) conveniently placed.

Thus the arm (6) is oriented by means of the rotation of the transversal bar (7) simultaneously with its movement, and the whole assembly is driven by a single actuating motor.

Therefore, once the inclination of the arm (6) is adjusted to the inclination of the storage tray (2), the lever (10) will push the transversal bar (7) moving the arm (6) and the printed circuit (3) away from the tray (2) according to the orientation imposed by the rod (13) to the end of the first rising linear section of the slot (8); in the falling curved second section of the slot (8) the descent and turning of the arm (6) and printed circuit (3) commences according to the orientation imposed by the rod (13) that starts to pivot about its end (14), up to the vertical linear third section of the slot (8) where the arm (6) descends in a horizontal position and deposits the printed circuit (3) on the conveyor belt (4), as in the position shown in FIG. 4.

Generally, the height with respect to the ground of the process lines differs because of which it is necessary to equip the loader/unloader with means to adapt to the different heights and to adjust the positioning of the printed circuits.

For this purpose the conveyor belt (4) pivots about its external end varying its inclination and therefore its height to reach the height of the corresponding process line.

On varying the inclination of the conveyor belt (4) it is necessary to modify the final inclination of the arm (6) so that they coincide, and the printed circuit (3) is correctly deposited/collected.

For this, the hinged point (14), about which the rod (13) pivots, is moveable on a swivel orifice (15) parallel to the rising linear first section of the slot (8). In this way, moving the hinged point (14) about which the rod (13) pivots along said swivel orifice (15) regulates the final inclination of the arm (6) in order to make it coincide with the inclination of the conveyor belt (4), without altering the inclination of the arm (6) when this is positioned opposite the tray (2).

What is claimed is:

1. Loader/unloader of printed circuits that includes a chassis (1) supporting a storage tray (2), a conveyor belt (4) and means for transfer of printed circuits (3) from the storage tray to the conveyor belt and vice versa, characterized in that this means of transfer consists of a handling device made up of an arm (6) equipped with suction pads (5) for securing the printed circuits, which is moveable angularly between a reception position, coinciding with the storage tray, to a final position coinciding with the conveyor belt, which arm is fastened to a transversal bar (7) that can move and turn between two identical slots (8) implemented in opposing positions in respective side panels (9) of the chassis; this bar being connected with freedom to turn, to an extendible lever (10) that is joined to the shaft of an actuating motor (11) and causes the movement of the bar along the slots, and connected with a pivoting rod (13), by means of a carriage (12) moveable along this rod, by means of which the rotation of the bar is produced.

2. Loader/unloader of printed circuits, according to claim 1 characterized in that the slots (8) implemented in the side panels comprise a rising linear first section, a falling curved second section and a vertical linear third section.

3. Loader/unloader of printed circuits, according to claim 2, characterized in that the rod (13) pivots about its free end, on a hinged point moveable on a swivel orifice (15), inclined and parallel to the rising linear first section of the slot.

4. Loader/unloader of printed circuits, according to claim 1, characterized in that the rod (13) pivots about its free end, on a hinged point moveable on a swivel orifice (15), inclined and parallel to the rising linear first section of the slot.

* * * * *